(12) United States Patent
Aksu et al.

(10) Patent No.: US 7,713,773 B2
(45) Date of Patent: May 11, 2010

(54) CONTACT LAYERS FOR THIN FILM SOLAR CELLS EMPLOYING GROUP IBIIIAVIA COMPOUND ABSORBERS

(75) Inventors: Serdar Aksu, Milpitas, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 61 days.

(21) Appl. No.: 11/565,971

(22) Filed: Dec. 1, 2006

(65) Prior Publication Data
US 2007/0145507 A1  Jun. 28, 2007

Related U.S. Application Data

(63) Continuation-in-part of application No. 11/266,013, filed on Nov. 2, 2005, and a continuation-in-part of application No. 11/462,685, filed on Aug. 4, 2006.

(60) Provisional application No. 60/862,164, filed on Oct. 19, 2006.

(51) Int. Cl.
*H01L 21/20* (2006.01)

(52) U.S. Cl. .......................................... 438/57; 438/86

(58) Field of Classification Search .................. 438/57, 438/84, 85, 86, 95
See application file for complete search history.

(56) References Cited

U.S. PATENT DOCUMENTS

| | | | |
|---|---|---|---|
| 2,499,808 A | 3/1950 | Yntema | |
| 3,721,938 A | 3/1973 | Entine et al. | |
| 4,492,811 A | 1/1985 | Switzer | |
| 4,536,607 A | 8/1985 | Wiesmann | |
| 4,581,108 A | 4/1986 | Kapur et al. | |

(Continued)

FOREIGN PATENT DOCUMENTS

WO    WO 01/39277    5/2001

(Continued)

OTHER PUBLICATIONS

Abou-Elfotouh, FA, et al., "Studies of the Electrical and Interface Properties of the Metal Contacts to CuInSe$_2$ Single Crystals", *J. Vac. Sci. Technol. A.*, 8(4), Jul./Aug. 1990, pp. 3251-3254.

(Continued)

*Primary Examiner*—Savitri Mulpuri
(74) *Attorney, Agent, or Firm*—Pillsbury, Winthrop, Shaw, Pittman LLP

(57) ABSTRACT

The present invention provides methods and apparatus for deposition of contact layers for Group IBIIIAVIA solar cells using electrodeposition and/or electroless deposition approaches, and solar cells that result therefrom. In one aspect of the invention, the solar cell that results includes a substrate, a stacked contact layer that includes a bottom film coated on a surface of the substrate and a top film formed by electroplating over the bottom film, wherein the top film comprises at least one of Ru, Ir and Os. A Group IBIIIAVIA compound film formed over the top film. In another aspect of the invention, there is provided a method of depositing a stacked layer of a plurality of films in a plurality of sequentially disposed depositing units onto a continuously moving roll-to-roll sheet, preferably using electroplating of a stacked contact layer.

6 Claims, 2 Drawing Sheets

U.S. PATENT DOCUMENTS

| | | | |
|---|---|---|---|
| 4,611,091 A | 9/1986 | Choudary et al. | |
| 4,670,334 A * | 6/1987 | Fujiwara et al. | 428/336 |
| 4,798,660 A | 1/1989 | Ermer et al. | |
| 4,837,068 A * | 6/1989 | Martin et al. | 428/133 |
| 4,915,745 A | 4/1990 | Pollock et al. | |
| 5,028,274 A | 7/1991 | Basol et al. | |
| 5,409,549 A | 4/1995 | Mori | |
| 5,436,204 A | 7/1995 | Albin et al. | |
| 5,489,372 A | 2/1996 | Hirano | |
| 5,501,786 A | 3/1996 | Gremion | |
| 5,567,469 A | 10/1996 | Wada | |
| 5,626,688 A | 5/1997 | Probst et al. | |
| 5,676,766 A | 10/1997 | Probst et al. | |
| 5,695,627 A | 12/1997 | Nakazawa | |
| 5,730,852 A | 3/1998 | Bhattacharya | |
| 5,804,054 A | 9/1998 | Bhattacharya | |
| 5,871,630 A | 2/1999 | Bhattacharya | |
| 6,048,442 A | 4/2000 | Kushiya | |
| 6,092,669 A | 7/2000 | Kushiya et al. | |
| 6,258,620 B1 | 7/2001 | Morel et al. | |
| 6,307,148 B1 | 10/2001 | Takeuchi et al. | |
| 2002/0011419 A1 * | 1/2002 | Arao et al. | 205/333 |
| 2003/0010644 A1 * | 1/2003 | Sonoda et al. | 205/141 |
| 2003/0230338 A1 * | 12/2003 | Menezes | 136/265 |
| 2005/0202589 A1 | 9/2005 | Basol | |
| 2005/0211291 A1 | 9/2005 | Bianchi | |
| 2005/0236037 A1 | 10/2005 | Ahn et al. | |
| 2006/0121701 A1 * | 6/2006 | Basol | 438/483 |
| 2007/0093006 A1 * | 4/2007 | Basol | 438/150 |
| 2007/0227633 A1 * | 10/2007 | Basol | 148/518 |
| 2007/0232065 A1 * | 10/2007 | Basol | 438/687 |
| 2008/0092947 A1 * | 4/2008 | Lopatin et al. | 136/255 |
| 2008/0093221 A1 * | 4/2008 | Basol | 205/170 |
| 2008/0175993 A1 * | 7/2008 | Ashjaee et al. | 427/255.26 |

FOREIGN PATENT DOCUMENTS

| | | |
|---|---|---|
| WO | WO 02/084708 | 10/2002 |
| WO | WO 2004/032189 | 4/2004 |
| WO | WO 2005/089330 | 9/2005 |

OTHER PUBLICATIONS

Barnard, WO, et al., "Comparison Between Ruthenium-based and Other Ohmic contact Systems to p-Type GaAs", Appl. Phys. Lett., 61(16), Oct. 19, 1992, pp. 1933-1935.

Britt, JS, et al., "Cost Improvement for Flexible CIGS-based Product", IEEE, 2006, pp. 388-391.

Dey, S., et al., "Platinum Group Metal Chalcogenides", Platinum Metals Rev., 48(1), 2004, pp. 16-29.

Ghosh, B., et al., "A Novel Back-Contracting Technology for $CuInSe_2$ Thin Films", Semiconduct. Sci. Tech., 11, 1996, pp. 1358-1362.

Huang, C.J. et al., "Formation of $CuInSe_2$ Thin Films on Flexible Substrates by Electrodepositon (ED) Technique", Solar Energy Mats. & Solar Cells, 82, 2004, pp. 553-565.

Jones, T., Electrodeposition and Electroless Deposition of Precious Metals, Ch. 3, "Deposition of Ruthenium", Finishing Publications Ltd., 2003, pp. 69-71.

Kadam, A., et al., "Study of Molybdenum Back Contract Layer to Achieve Adherent and Efficient CIGS2 Absorber Thin-Film Solar Cells", J. Vac. Sci. Tech. A., 23(4), Jul./Aug. 2005, pp. 1197-1201.

Kim, YS, et al., "Electrochemically Deposited Ruthenium Seed Layer Followed by Copper Electrochemical Plating", Electrochem. & Solid State Lett., 9(1), 2006, pp. C19-C23.

Lide, D., CRC Handbook of Chemistry and Physics, "Periodic Table of the Elements", CRC Press, $85^{th}$ Ed., 2004-2004, 1 page.

Malmstrom, J., et al., "Enhanced Back Reflectance and Quantum Efficiency in $Cu(In,Ga)Se_2$ Thin Film Solar Cells with ZrN Back Reflector", Appl. Phys. Letts., 85(13), Sep. 27, 2004, pp. 2634-2636.

Moffat, TP, et al., Electrodeposition of Cu on Ru Barrier for Damascene Processing, J. of the Electrochem. Soc., 153(1), 2006, pp. C37-C50.

Moons, E., et al., "Ohmic Contacts to P-$CuInSe_2$ Crystals", J. of electron. Mats., 22(3), 1993, pp. 275-280.

Myburg, G., et al., "Annealing Characteristics and Thermal Stability of Electron Beam Evaporated Ruthenium Schottky contacts to n-GaAs", Appl. :hys. Lett., 60(5), Feb. 3, 1992, pp. 604-606.

Nelson, A., et al., "Formation of Schottky Barrier Height of Au Contacts to $CuInSe_2$ ", J. Vac. Sci. Technol. A., 9(3), May/Jun. 1991, pp. 978-982.

Orgassa, K., et al., "Alternative Back Contact Materials for Thin Film $Cu(In,Ga)Se_2$ Solar Cells", Thin Solid Films, 431-432, 2003, pp. 387-391.

Schulz, KJ, et al., "Interfacial Reactions in the Ir/GaAs System", J. Appl. Phys., 67(11), Jun. 1, 1990, pp. 6798-6806.

Vadimsky, RG., et al., "Ru and $RuO_2$ as Electrical Contact Materials",, J. Electrochem. Soc., Nov. 1979, pp. 2017-2023.

Weisberg, A., "Ruthenium Plating", Metal Finishing, M. Murphy, Editor, The Audit Bureau, $71^{st}$ Guidebook and Director, 101(1A), Jan. 2003, p. 243.

Bhattacharya, R.N., et al., "$CuIn_{1-x}Ga_xSe_2$-based Photovoltaic Cells from Electrodeposited Precursor Films", Solar Energy Mats & Solar Cells, vol. 76, 2003, pp. 331-337.

Binsma, J.J., et al., "Preparation of Thin $CuInS_2$ Films via a Two Stage Process", Thin Solid Films, 97, 1982, pp. 237-243.

Calixto, M.E., et al., "$CuInSe_2$ Thin Films Formed by Selenization of Cu-In Precursors", J. of Mats. Sci., 33, 1998, pp. 339-345.

Chirabi et al., "Influence of Citrate Ions as Complexing Agent for electrodeposition of CuInSe2 Thin Films", Phys. Stat. Sol., (a), 2001, vol. 186, No. 3, pp. 373-381.

Ezzaouia, et al., "Synthesis of Ruthenium and Osmium Dichalocgenide Single Crystals", J. of Mat. Science Lett., 1994, vol. 3, pp. 625-626.

Fernandez, et al., "Electrodeposited and Selenized ($CuInSe_2$) (CIS) Thin Films for Photovoltaic Applications", Solar Energy Materials and Solar Cells,52, 1998, pp. 423-431.

Friedfeld, R., et al., "Electrodeposition of $CuIn_xGa_{1-x}Se_2$ Thin Films", Solar Energy Mats. & Solar Cells, 58, 1999, pp. 375-385.

Fritz, H.P., et al., "A New Electrochemical Method for Selenization of Stacked CuIn Layers and Preparation of $CuInSe_2$ by Thermal Annealing", Thin Solid Films, 247, 1994, pp. 129-133.

Ganchev, M., et al., "Preparation of $Cu(In,Ga)Se_2$ Layers by Selenization of Electrodeposited Cu-In-Ga Precursors", Thin Solid Films, 511-512, 2006, pp. 325-327.

Grindle, S.P., et al., "Preparation and Properties of $CuInS_2$ Think Films Produced by Exposing rf-Sputtered Cu-In Films to an $H_2S$ Atmosphere", Appl. Phys. Lett, 35(1) Jul. 1, 1979, pp. 24-26.

Guillen, C., et al., "New Approaches to Obtain $CuIn_{1-x}Ga_xSe_2$ Thin Films by Combining Electrodeposited and Evaporated Precursors", Thin Solid Films323, 1998, pp. 93-98.

Guillen, C.,et al., "$CuInSe_2$ Thin Films Obtained by a Novel Electrodeposition and Sputtering Combined Method," Vacuum, 58, 2000, pp. 594-601.

Gupta, A., et al., "$CuInS_2$ Films Prepared by Sulfurization of Electroless Deposited Cu-In Alloy", Solar Energy Mats., 18, 1988, pp. 1-8.

Hansen, "Cu-Ga Copper Gallium", Constitution of Binary Alloys, $2^{nd}$ Ed., McGraw Hill, pp. 582-584 (1958).

Kampmann, A., et al., "Electrodeposition of CIGS on Metal Substrates", Mat. Res. Soc. Symp. Proc., 763, 2003, pp. B8.5.1-B8.5.6.

Kapur, V.K., et al., "Low Cost Thin Film Chalcopyrite Solar Cells", IEEE, 1985, p. 1429-1432.

Kapur, V.K., et al., "Low Cost Methods for the Production of Semiconductor Films for $CuInSe_2$/CdS Solar Cells", Solar Cells, 21, 1987, pp. 65-72.

Kim, et al., "Preparation of $CuInSe_2$ Thin Films Using Electrodeposited In/Cu Metallic Layer", First WCPEC, Dec. 5-9, 1994, Hawaii, IEEE, pp. 202-205.

Kumar, et al., "Properties of $CuInSe_2$ Films Prepared by the Rapid Thermal Annealing Technique", Thin Solid Films, 223, 1993, pp. 109-113.

Lokhande, C., et al., "Preparation of CuInSe$_2$ and CuInS$_2$ Films by Reactive Annealing in H$_2$ Se$_2$ or H$_2$ S", *Solar Cells*,, 21, 1987, pp. 215-224.

Rudiger, M., "Photoelectrochemical Solar Energy Conversion," *Topics in Current Chemistry*, 1988, vol. 143, pp. 79-112.

Subramanian, P., et al., "The Cu-In(Copper Indium) System", Bulletin of Alloy Phase Diagram, vol. 10, No. 5, pp. 554-568 (1989).

Supplemental Search Report issued Dec. 14, 2009 in EP 07 75 2440.

* cited by examiner

CONTACT LAYERS FOR THIN FILM SOLAR CELLS EMPLOYING GROUP IBIIIAVIA COMPOUND ABSORBERS

CLAIM OF PRIORITY

This application is a continuation-in-part of and claims priority to U.S. application Ser. No. 11/266,013 filed Nov. 2, 2005 entitled "Technique and Apparatus for Depositing Layers of Semiconductors for Solar Cell and Module Fabrication" and is a continuation in part of and claims priority to U.S. application Ser. No. 11/462,685 filed Aug. 4, 2006 entitled Technique for Preparing Precursor Films and Compound Layers for Thin Film Solar Cell Fabrication and Apparatus Corresponding Thereto", and also claims priority to U.S. Provisional Appln. Ser. No. 60/862,164 filed Oct. 19, 2006 entitled "Roll-To-Roll Electroplating for Photovoltaic Film Manufacturing", each of which are also expressly incorporated by reference herein.

FIELD OF THE INVENTION

The present invention relates to deposition of contact layers for Group IBIIIAVIA solar cells using electrodeposition and/or electroless deposition approaches.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a base 10A which includes a substrate 11 coated with a conductive layer 13. The substrate 11 may be in various forms and shapes, such as a sheet of glass, a sheet of metal (such as aluminum or stainless steel), an insulating foil or web (such as polyimide), or a conductive foil or web (such as stainless steel) or even cylindrical or spherical parts. Various metallic foil substrates (such as Cu, Ti, Mo, Ni, Al) have previously been identified for CIGS(S) solar cell applications (see for example, B. M. Basol et al., "Status of flexible CIS research at ISET", NASA Document ID:19950014096, accession No: 95N-20512, available from NASA Center for AeroSpace Information, and B. M. Basol et al., "Modules and flexible cells of $CuInSe_2$", Proceedings of the $23^{rd}$ Photovoltaic Specialists Conference, 1993, page 426). The absorber film 12, which comprises a material in the family of $Cu(In,Ga,Al)(S,Se,Te)_2$, is grown over the conductive layer 13, which is previously deposited on the substrate 11 and which acts as the electrical contact to the device. Various conductive layers 13 or contact layers comprising contact materials such as Mo, Ta, W, Ti, TiN etc. have been used in the solar cell structure of FIG. 1. If the substrate itself is a properly selected conductive material, it is possible not to use a conductive layer 13, since the substrate 11 may then be used as the ohmic contact to the device. The conductive layer 13 may be a single layer or a stacked layer. For example, Cr/Mo stacked conductive layer is commonly used in the CIGS(S) solar cell structure because Cr improves adhesion of Mo to the substrate. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. It should be noted that the structure of FIG. 1 may also be inverted if substrate is transparent. In that case light enters the device from the substrate side of the solar cell.

The first technique used to grow $Cu(In,Ga)Se_2$ layers was the co-evaporation approach which involves evaporation of Cu, In, Ga and Se from separate evaporation boats onto a heated substrate, as the deposition rate of each component is carefully monitored and controlled. Another technique for growing $Cu(In,Ga)(S,Se)_2$ type compound thin films for solar cell applications is a two-stage process where at least two of the components (components being Cu, In, Ga, Se and S) of the $Cu(In,Ga)(S,Se)_2$ material are first deposited onto a substrate, and then reacted with S and/or Se in a high temperature annealing process. For example, for $CuInSe_2$ growth, thin films of Cu and In are first deposited on a substrate to form a precursor layer and then this stacked precursor layer is reacted with Se at elevated temperature. If the reaction atmosphere contains sulfur, then a $CuIn(S,Se)_2$ layer can be grown. Addition of Ga in the precursor layer, i.e. use of a Cu/In/Ga stacked film precursor, allows the growth of a $Cu(In,Ga)(S,Se)_2$ absorber. Other prior-art techniques include deposition of Cu—Se/In—Se, Cu—Se/Ga—Se, or Cu—Se/In—Se/Ga—Se stacks and their reaction to form the compound. Mixed precursor stacks comprising compound and elemental films, such as a Cu/In—Se stack or a Cu/In—Se/Ga—Se stack, have also been used, where In—Se and Ga—Se represent selenides of In and Ga, respectively.

Sputtering and evaporation techniques have been used in prior art approaches to deposit the individual layers or films containing the Group IB and Group IIIA components of metallic precursor stacks. In the case of $CuInSe_2$ growth, for example, Cu and In films were sequentially sputter-deposited from Cu and In targets on a substrate and then the stacked precursor layer or film thus obtained was heated in the presence of gas containing Se at elevated temperatures as described in U.S. Pat. No. 4,798,660. More recently U.S. Pat. No. 6,048,442 disclosed a method comprising sputter-depositing a stacked precursor film comprising a Cu—Ga alloy film and an In film to form a Cu—Ga/In stack on a metallic back electrode and then reacting this precursor stack film with one of Se and S to form the compound absorber layer. U.S. Pat. No. 6,092,669 described sputtering-based equipment and method for producing such absorber layers.

The standard processing approach for the preparation of conductive layers or contact layers that make ohmic contact to CIGS(S) type solar cells is sputtering and the most commonly used contact material is Mo. Electro-beam evaporation has also been used for Mo contact deposition. Sputtering is an expensive vacuum technique with limited materials utilization. Planar magnetron processes typically yield 30-40% materials utilization. A recent publication points out that taking into account other losses in the process Mo target utilization in a sputtering technique may be only about 12% (J. Britt, et al., Proceedings of 4th World Conf. on PV Energy Conversion, p. 388). Although cylindrical magnetron sputtering may increase this utilization to a higher range, cost involved in the preparation of a cylindrical target is higher than the cost of a planar target.

As the brief discussion above shows there is a need to develop new contact materials for Group IBIIIAVIA—based solar cell structures and to develop low cost techniques with high materials utilization to manufacture conductive layers or contact layers that act as efficient ohmic contacts to these devices.

SUMMARY OF THE INVENTION

The present invention relates to methods and apparatus for deposition of contact layers for Group IBIIIAVIA solar cells using electrodeposition and/or electroless deposition approaches, and solar cells that result therefrom.

In one aspect of the invention, the solar cell that results includes a substrate, a stacked contact layer that includes a bottom film coated on a surface of the substrate and a top film formed by electroplating over the bottom film, wherein the top film comprises at least one of Ru, Ir and Os. A Group IBIIIAVIA compound film formed over the top film.

In another aspect of the invention, there is provided a method of depositing a stacked layer of a plurality of films in a plurality of sequentially disposed depositing units onto a continuously moving roll-to-roll sheet, preferably using electroplating of a stacked contact layer. The method includes continuously moving the roll-to-roll sheet through each of the plurality of sequentially disposed depositing units so that continuous portions of a top surface of the roll-to-roll sheet are positioned for depositing to occur thereon when disposed in each of the depositing units, and continuously depositing each one of the films onto the top surface of the roll-to-roll sheet, at least some of the films being deposited by electroplating as the roll-to-roll sheet moves through electroplating depositing units. The plurality of films sequentially including a contact layer comprising a bottom film and a top film, wherein the top film comprises at least one of Ru, Os and Ir, and a precursor layer comprising at least one Group IB material film and at least one Group IIIA material film.

In a further aspect of the method, all of the films are deposited by electroplating using electroplating units.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION

Figure 1:
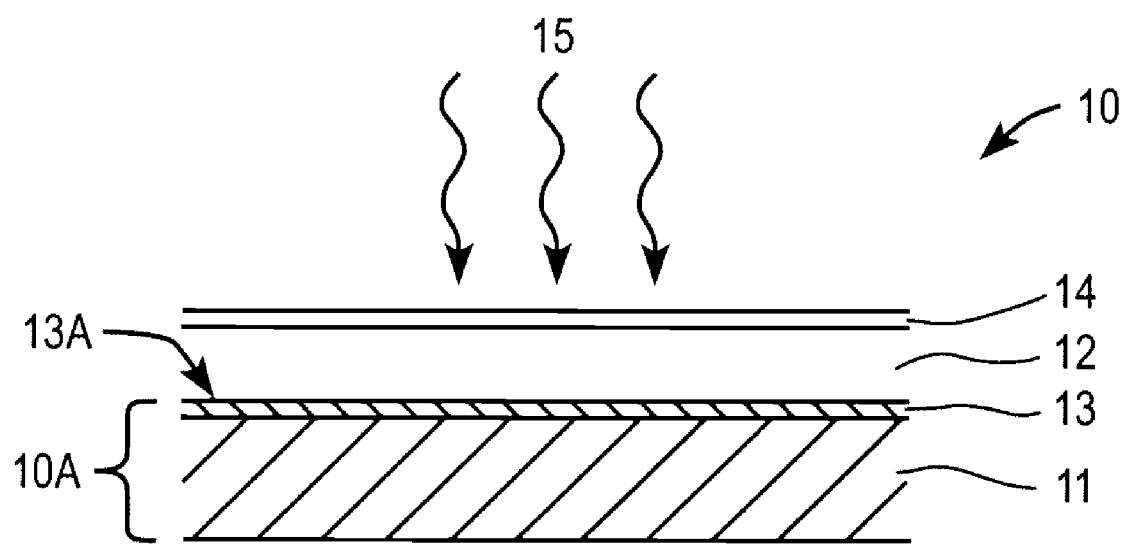
FIG. 1 is a cross-sectional view of a solar cell employing a Group IBIIIAVIA absorber layer.

Present invention provides materials, methods and apparatus to fabricate conductive layers or contact layers for thin film solar cells, especially for those solar cells that employ Group IBIIIAVIA compound absorbers. Based on the brief review above one can conclude that irrespective of the specific approach employed in growing a CIGS(S) or Cu(In,Ga)(S,Se)$_2$ type absorber film, the conductive layer 13 (or the contact layer) of FIG. 1 needs to have certain properties. These properties include, but are not limited to the following: i) the contact layer surface 13A should make a good ohmic contact to the absorber layer 12, ii) the contact layer 13 or the contact layer surface 13A should be stable in the reaction environments in which the absorber layer 12 is formed, i.e. they should not extensively react with Group VIA materials to the extent that they loose their ohmic nature or cause mechanical peeling problems, iii) the contact layer 13 or the contact layer surface 13A should not react extensively with the Group LB and Group IIIA materials present in the absorber layer 12. For example, for a CIGS(S) absorber, the contact layer to this absorber should not react extensively with Cu, In, Ga, Se and S and still make good ohmic contact with excellent adhesion to the CIGS(S) material. U.S. patent application Ser. No. 11/266,013 filed Nov. 5, 2005 entitled "Technique And Apparatus For Depositing Layers Of Semiconductors For Solar Cell And Module Fabrication"; U.S. patent application Ser. No. 11/462,685 filed Aug. 4, 2006 entitled "Technique For Preparing Precursor Films And Compound Layers For Thin Film Solar Cell Fabrication"; and U.S. Provisional Appln. Ser. No. 60/820,333 filed Jul. 26, 2006 entitled "Tandem Solar Cell Structures And Methods Of Manufacturing Same", have identified the group of materials (such as elements, alloys, compounds, mixtures etc.) comprising at least one of Ru, Ir and Os as new contact materials to Group IBIIIAVIA compound layers. Therefore, materials comprising at least one of Ru, Ir and Os may be used in the solar cell structure of FIG. 1 as the conductive layer 13 or such materials may be provided at the contact layer surface 13A.

In prior art Ru layers have been used as durable, low-tarnish coatings on electrical connectors such as reed switch contacts (see e.g. R. Vadimsky et al., J. Electrochemical Society, vol: 126, p. 2017, 1979 and T. Jones, "Electrodeposition and Electroless Deposition of the Precious Metals", p. 69, Finishing Publications Limited, 2005). Other applications of this material include color finishing in jewelry, cutlery, sanitary fittings etc. A recent application of Ru is in copper interconnect fabrication for Si wafers. In this application, a thin layer of Ru is deposited on patterned wafer surface as a barrier layer and then Cu is directly electroplated on the Ru surface to fill the features or gaps in a bottom-up fashion, one wafer at a time (see for example, T. Moffat et al., J. Electrochemical Society, vol. 153, p. C37, 2006, and Y. Kim et al., Electrochemical and Solid State Letters, vol. 9, p. C19, 2006). It has been stated that for certain Ru plating electrolytes, it is recommended that Ru is electroplated over a gold or palladium flash layer (A. Weisberg, Metal Finishing, Volume 101, Number 1A, p. 243, 2003).

In addition to being good ohmic contact materials to Group IBIIIAVIA compounds, materials comprising at least one of Ru, Ir and Os may also be deposited using low cost wet techniques with near 100% materials utilization. These wet techniques include, but are not limited to ink deposition of inks (made from nano-particles comprising at least one of Ru, Ir or Os), electrodeposition and electroless plating. Furthermore, high throughput roll-to-roll processing approaches may be used for depositing these materials using the wet techniques. We will now describe electroplated conductive layers or contact layers using the preferred contact material Ru as the example. It should be noted that these arguments are valid for Ir and Os as well as many other materials with compositions of Ru-M, Os-M, Ir-M, where M may be any material comprising at least one element except those elements belonging to the Groups VIIA and VIIIA of the periodic table.

Figure 2A:
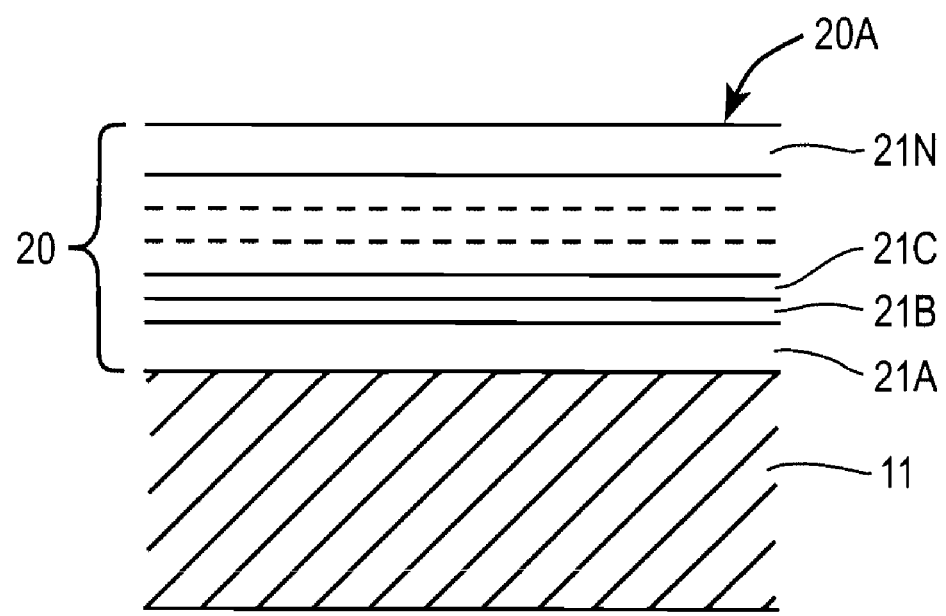
FIG. 2A shows a multi-film contact layer deposited on a substrate.
Figure 2B:
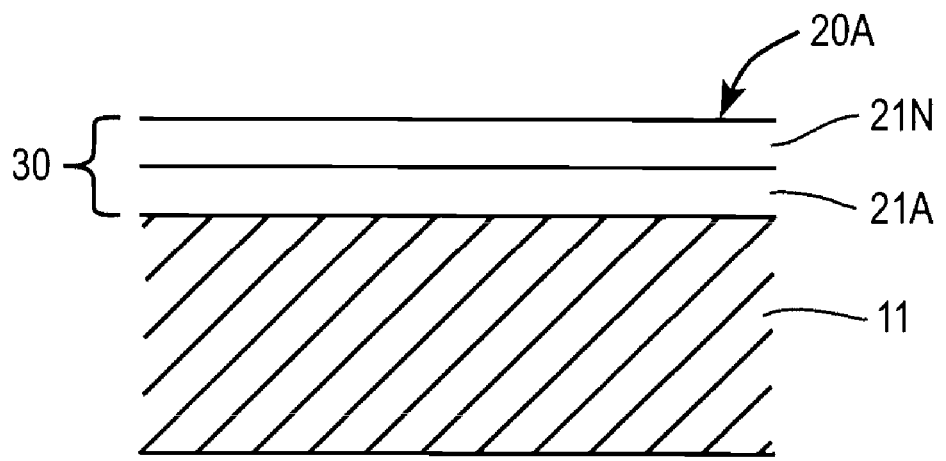
FIG. 2B shows a multi-film contact layer comprising two films deposited on a substrate.

FIG. 2A shows a multi-film contact 20 that may be employed in a Group IBIIIAVIA compound solar cell such as a CIGS(S) solar cell structure. In that respect the multi-film contact 20 acts as the conductive layer 13 or contact layer of FIG. 1. The multi-film contact 20 is deposited on the substrate 11 in the form of multiple films, comprising a bottom film 21A, a top film 21N and intermediate films 21B, 21C, etc. between the bottom film 21A and the top film 21N. The bottom film 21A and the intermediate films 21B, 21C, etc., provide a foundation on which the top film 21N is electroplated or electroless plated in a uniform and continuous manner, without defects such as pinholes. The top film 21N comprises at least one of Ru, Ir and Os, at least at its surface 20A where ohmic contact to the CIGS(S) layer of the finished solar cell would be made. It should be noted that although the top film 21N maybe directly electroplated or electroless plated on the substrate 11, the preferred approach is to have at least one film between the top film 21N and the substrate 11. For brevity, we will continue to describe the invention using as an example a two-film contact 30 with a bottom film 21A and a top film 21N, as shown in FIG. 2B. The top film 21N of FIG. 2B comprises at least one of Ru, Ir and Os, at least at its surface 20A, and it is electroplated or electroless plated. Preferably, the top film 21N is electroplated. The bottom film 21A of FIG. 2B may comprise a wide variety of conductive materials including, but not limited to, materials from the periodic table Groups of IIIB, IVB, VB, VIB, VIIB, VIII, IB, IIB, IIIA, IVA, VA and VIA (CAS notation is used for identification of groups; see Periodic Table of Elements in CRC Handbook of Chemistry and Physics, $85^{th}$ edition, 2004-2005). The preferred materials for the formation of the bottom film 21A are Cu, Ni, Sn, Zn, Rh, Pt, Rh, Mn, Fe, Co, Cr, Au, Ag, Pd, W, Mo, Ta, Ru, Ir, Os and/or their alloys, compounds or mixtures with each other or with other materials. The bottom film 21A may be deposited on the substrate 11 by various techniques such as sputtering, evaporation, atomic layer deposition, chemical vapor deposition, etc. Atomic layer deposition (ALD) has die capability to coat the substrate surface in a conformal manner and form a robust diffusion barrier, free of pinholes and other defects. However, ALD is a slow process having typical growth rates in the range of 0.1-1 nm/min. Therefore, having a bottom film 21A deposited by ALD and electroplating intermediate films and a top film 21N, or just a top film 21N over die ALD deposited bottom film 21A is attractive in terms of higher throughput, cost lowering and good diffusion barrier performance of the multi-film contact. It should be noted that CIGS(S) devices get negatively affected by impurities that may diffuse from the substrate 11 of FIG. 1, through die conductive layer 13 or the contact layer, into the CIGS(S) layer. If an ALD process is used for the deposition of a bottom film 21A (see FIGS. 2A and 2B), it is preferable that the bottom film 21A is a good diffusion barrier for elements in the substrate composition that can negatively impact device performance. Such elements include Fe for stainless steel substrates and Al for Al-based substrates. Diffusion barrier materials that may be used as bottom film 21A include Ru, Ir, Os, Cr, Mo, W, their alloys with each other and other materials, etc.

In a preferred embodiment the bottom film 21A is deposited by an electrodeposition or electroless deposition approach. The motivations for an approach where both the bottom film 21A and the top film 21N of FIG. 2B are electroplated or electroless plated, are lowering of the cost, as well as improving the coverage of the surface of the substrate 11. Techniques such as evaporation and sputtering do not yield conformal coatings. The surface coverage problem in such techniques is due to the directional deposition and shadowing effect of the substrate surface irregularities which may be in the form of surface roughness in the order of 50-200 nm. Wet chemical deposition techniques such as electroplating and electroless deposition are more conformal and cover such surface roughness or features. Furthermore, additives such as organic additives may be included in the electrodeposition baths of the bottom film 21A so that the surface of the bottom film 21A is much smoother than the surface of the substrate 11. For example, the surface roughness of the bottom film 21A may be in the range of 10-50 nm. This way the top film 21N is deposited on the smooth surface of the bottom film 21A in a defect free manner. Electroplating and electroless plating may be used to deposit numerous metallic elemental or alloy films as the bottom film 21A. If the substrate is conductive, electroplating is more suitable than electroless plating. In the case of a nonconductive substrate, an initial conductive seed layer could be deposited using electroless deposition. This then may be followed by an electrodeposition step. We will now continue our discussion of an embodiment of the present invention concentrating on a conductive substrate and electrodeposited films to form the contact layer structures shown in FIGS. 2A and 2B.

Preparation of the surface of a substrate for electrodeposition of a bottom film 21A comprises removing all foreign matter or contaminants (soil, dirt, corrosion products, oxides, tarnish and others), and then providing a clean and chemically active substrate surface for plating. The removal of foreign contaminants can be accomplished by using chemical cleaners such as alkaline cleaners, electropolishing, detergent cleaners etc. Voltage may be applied between an electrode and the substrate rendering the substrate surface either anodic or cathodic during the cleaning step. It is also possible to apply a pulsed voltage with periodic reverse current during this cleaning process. After cleaning, activation of the substrate surface may be achieved by exposing it to a concentrated acid solution. Surface preparation for a stainless steel substrate surface, for example, may be carried out in multiple steps comprising, alkaline cleaning, water rinsing, alkaline deoxidizing with periodic reverse current, water rinsing, and surface activation with 20-60% HCl.

After activation of the substrate surface a bottom film 21A (see FIG. 2B) may be electroplated. For stainless steel substrates the bottom film 21A may preferably be a Ni layer, a Cu layer, a Co layer, an Au layer or alloys of these materials with each other or with other materials. One exemplary bottom film to electroplate on a surface of a stainless steel substrate is a Ni film that may be deposited on activated steel surface through use of a Ni-chloride+HCl bath known as "Woods Ni bath". A Ni layer deposited this way provides an active surface over which a top film 21N comprising at least one of Ru, Ir and Os may be electroplated. In the case of Al or Al-alloy substrates, the substrate surface may first be cleaned and acid pickled for activation. A thin layer of Zn may then be deposited on the surface of the Al-based substrate using immersion deposition by displacement from an alkaline zincate solution An exemplary formulation of a zincate bath comprises zinc oxide (50-100 g/L) and sodium hydroxide (250-500 g/L). The thin Zn layer may act as the bottom film 21A of FIG. 2B. A top film 21N may then be electrodeposited over the thin Zn layer.

It should be noted that once a bottom film such as a Ni layer or a Zn layer is formed on a stainless steel or Al substrate, respectively, intermediate films may also be electroplated (see FIG. 2A) over the bottom film 21A before electrodeposition of the top film. This way all-electroplated contact layer structures including, but not limited to Ni/Pd—Co/Ru, Ni/Co/Ru, Co/Ni/Ru, Ni/Cu/Ru, Cu/Ni/Ru, Ni/Cu/Co/Ru, etc. may be fabricated. If intermediate films are not used contact layer structures such as Ni/Ru, Zn/Ru, Cu/Ru, Co/Ru, Cr/Ru etc. may be obtained.

The exemplary Ru layer of a top film 21N of FIGS. 2A and 2B may be electroplated on any intermediate film or bottom film using an exemplary electroplating formulation comprising 0.01-0.1 M $RuCl_3.3H_2O$, 0.01-0.1 M HCl, and 0.01-0.1 M $NH_2SO_3H$ at a temperature of 20-80 C. Ru electrodeposition may be performed at current densities ranging from 0.5 $mA/cm^2$ to 50 $mA/cm^2$. Thickness of a bottom film, and an intermediate film may be in the range of 10-500 nm, preferably in the range of 20-200 nm. The thickness of a top film comprising at least one of Ru, Ir and Os may be 1-500 nm, preferably 20-200 nm. There are other Ru electroplating electrolyte available based on acidic or high pH formulations. Ru-oxide may also be substituted for Ru in this invention.

As described above, the novel contact layers of the present invention may be electroplated and/or electroless plated on a substrate to form a base on which a Group IBIIIAVIA compound solar cell may be fabricated. Growth of the Group IBIIIAVIA compound absorber may be carried out by various different methods including sputtering, evaporation, two-stage processing, ink deposition etc. One preferred approach is the use of electroplating on the electrodeposited contact, a precursor layer comprising Group IB, Group IIIA and optionally Group VIA materials, and then annealing and/or reacting the precursor with at least one Group VIA material to form the compound absorber. In an exemplary process, a top surface of a 5-mil thick stainless steel substrate was cleaned and activated as described above. A 200 nm thick Ni bottom film was electroplated on the top surface using the Woods Ni bath. After rinsing the deposited Ni surface, a 100 nm thick Ru film was electroplated on the Ni surface. This way an all-electroplated Ni/Ru contact layer was obtained on the top surface of the stainless steel substrate. To prepare a precursor film comprising Cu, In and Ga, the following procedures were carried out. A 200 nm thick Cu layer was electroplated on the Ru surface. A 100 nm thick Ga layer was electroplated on the Cu surface. This was then followed by the deposition of a 350 nm thick In layer out of a sulfamate electrolyte supplied by the Indium Corporation of America. Electrolytes for the Cu and Ga deposition have been disclosed in U.S. patent application Ser. No. 11/462,685 filed Aug. 4, 2006 entitled "Technique for Preparing Precursor Films and Compound Layers For Thin Film Solar Cell Fabrication and Apparatus Corresponding Thereto" and U.S. patent application Ser. No. 11/535,927 filed Sep. 27, 2006 entitled "Efficient Gallium Thin Film Electroplating Methods and Chemistries". These procedures yielded a stainless steel/Ni/Ru/Cu/Ga/In structure where all layers on the stainless steel substrate were electrodeposited. The structure was reacted with Se at 500 C for 20 minutes yielding a stainless steel/Ni/Ru/CIGS stack that could then be used for solar cell fabrication using steps commonly known in the field. These steps include deposition of a CdS layer on the CIGS surface followed by ZnO deposition and finger pattern deposition.

It should be noted that the present invention is suited for high throughput, low cost roll-to-roll processing approaches. In roll-to-roll processing, the substrate is in the form of a flexible web or wire. The substrate is fed from a supply spool and travels through various process units before it is rolled onto a return spool. The process steps of electroplated contact layer formation approach described above may be carried out in various process units of a roll-to-roll process system. Cleaning of the substrate surface, its activation, deposition of a bottom film, deposition of intermediate films, deposition of a top film, and thus formation of a multi-film contact may be achieved roll-to-roll on a web or wire substrate as the substrate travels through various electroplating units. Further, the system may comprise other process units to continue electrodeposition over the top film of the multi-film contact to form a precursor layer comprising Cu. In, Ga and optionally Se. Annealing units, cleaning units etc. may also be added to these systems to carry out a large number of process steps in a roll-to-roll configuration. Examples of such system configurations have been disclosed in applicant's co-pending U.S. patent application Ser. No. 11/081,308 filed Mar. 15, 2005 entitled "Technique and Apparatus for Depositing Thin Layers of Semiconductors For Solar Cell Fabrication,"; U.S. patent application Ser. No. 11/560/321, filed Nov. 15, 2006 entitled "Composition Control for Roll-to-roll Processed Photovoltaic Films" and U.S. Provisional Appln. Ser. No. 60/862,164 filed Oct. 19, 2006 entitled Roll-To-Roll Electroplating For Photovoltaic Film Manufacturing".

Although the present invention is described with respect to certain preferred embodiments, modifications thereto will be apparent to those skilled in the art.

I claim:

1. A method of depositing a stacked layer of a plurality of films in a plurality of sequentially disposed depositing units onto a continuously moving roll-to-roll sheet comprising the steps of:
   continuously moving the roll-to-roll sheet through each of the plurality of sequentially disposed depositing units so that continuous portions of a top surface of the roll-to-roll sheet are positioned for depositing to occur thereon when disposed in each of the depositing units; and
   continuously depositing each one of the films onto the top surface of the roll-to-roll sheet as the roll-to-roll sheet moves through electroplating the units, the plurality of films sequentially including:
      a contact layer comprising a bottom metal film, a top metal film, and at least one intermediate film between the bottom metal film and the top metal film, wherein the bottom film comprises at least one of Zn, Cu, Ni and Co, wherein the top metal film comprises at least one of Ru, Os and Ir, and wherein the at least one intermediate film comprises at least one of Zn, Cu, Ni and Co; and
      a precursor layer comprising at least one Group IB material film and at least one Group IIIA material film, wherein the step of continuously depositing deposits all of the films by at least one of electroplating and electroless plating, and wherein each of the depositing units is one of electroplating and electroless plating depositing units.

2. The method according to claim 1 wherein the step of continuously depositing deposits all of the films by electroplating, and wherein each of the depositing units is electroplating depositing units.

3. The method according to claim 1 wherein the precursor layer further comprises at least one Group VIA material film.

4. The method according to claim 1 wherein at least one Group IB material film is a Cu film and at least one Group IIIA material film comprises an In film and a Ga film.

5. The method according to claim 3 wherein the at least one Group VIA material film is a Se film.

6. The method according to claim 5 wherein at least one Group IB material film is a Cu film and at least one Group IIIA material film comprises an In film and a Ga film.

* * * * *